United States Patent

Ishikawa

[11] Patent Number: 5,945,725
[45] Date of Patent: Aug. 31, 1999

[54] SPHERICAL SHAPED INTEGRATED CIRCUIT UTILIZING AN INDUCTOR

[75] Inventor: Akira Ishikawa, Royce City, Tex.

[73] Assignee: Ball Semiconductor, Inc., Allen, Tex.

[21] Appl. No.: 09/112,839

[22] Filed: Jul. 10, 1998

Related U.S. Application Data

[63] Continuation-in-part of application No. 08/858,004, May 16, 1997
[60] Provisional application No. 60/032,340, Dec. 4, 1996.

[51] Int. Cl.$^6$ .................................................. H01L 29/06
[52] U.S. Cl. ............................................. 257/531; 257/618
[58] Field of Search ................................. 257/618, 627, 257/653, 664, 531

[56] References Cited

U.S. PATENT DOCUMENTS

| | | |
|---|---|---|
| 3,521,350 | 7/1970 | Knippenberg et al. . |
| 3,534,467 | 10/1970 | Sachs et al. . |
| 3,593,191 | 7/1971 | Henker . |
| 3,988,232 | 10/1976 | Wasa et al. . |
| 3,998,659 | 12/1976 | Wakefield . |
| 4,094,751 | 6/1978 | Nozik . |
| 4,100,051 | 7/1978 | Kilby et al. . |
| 4,100,422 | 7/1978 | Thillays . |
| 4,126,812 | 11/1978 | Wakefield . |
| 4,136,436 | 1/1979 | Kilby et al. . |
| 4,152,712 | 5/1979 | Myers . |
| 4,173,494 | 11/1979 | Johnson et al. . |
| 4,270,263 | 6/1981 | Johnson et al. . |
| 4,407,320 | 10/1983 | Levine . |
| 4,420,731 | 12/1983 | Schiebold et al. ...................... 333/219 |
| 4,451,968 | 6/1984 | Jensen et al. . |
| 4,548,658 | 10/1985 | Cook . |
| 4,614,835 | 9/1986 | Carson et al. . |
| 4,637,855 | 1/1987 | Witter et al. . |
| 4,806,495 | 2/1989 | Levine et al. . |
| 4,834,856 | 5/1989 | Wehner . |
| 4,879,466 | 11/1989 | Kitaguchi et al. . |
| 4,952,425 | 8/1990 | Allen et al. . |
| 5,028,546 | 7/1991 | Hotchkiss . |
| 5,069,740 | 12/1991 | Levine et al. . |
| 5,081,519 | 1/1992 | Nishimura . |
| 5,086,003 | 2/1992 | Hammerbacher . |
| 5,106,455 | 4/1992 | Jacobsen et al. . |
| 5,131,976 | 7/1992 | Hoko . |
| 5,269,882 | 12/1993 | Jacobsen . |
| 5,278,097 | 1/1994 | Hotchkiss et al. . |
| 5,358,603 | 10/1994 | Ibrahim et al. . |
| 5,382,412 | 1/1995 | Kim et al. . |
| 5,405,658 | 4/1995 | Ibrahim et al. . |
| 5,431,127 | 7/1995 | Stevens et al. . |
| 5,457,333 | 10/1995 | Fukui . |
| 5,466,301 | 11/1995 | Hammerbacher et al. . |
| 5,588,993 | 12/1996 | Holder . |
| 5,659,184 | 8/1997 | Tokunaga et al. . |
| 5,767,816 | 6/1998 | Cosman ................................. 343/788 |
| 5,801,591 | 9/1998 | Parrott ..................................... 331/96 |

FOREIGN PATENT DOCUMENTS

| | | |
|---|---|---|
| 1084-021082 | of 1984 | Japan . |
| 1093-284499 | 10/1993 | Japan . |
| 6-302799 | 11/1994 | Japan . |

OTHER PUBLICATIONS

Nakata, Gravity–Dependent Silicon Crystal Growth Using a Laser Heating System in drop Shaft, Sep. 1, 1994, pp. L1202–L1204.

*Primary Examiner*—David B. Hardy
*Attorney, Agent, or Firm*—Haynes and Boone, L.L.P.

[57] ABSTRACT

An apparatus and method for forming an inductor on a spherical shaped integrated circuit for use in a rectifier circuit and/or an antenna. The integrated circuit is formed around a spherical substrate and includes a conductive layer. Signal lines formed from of the conductive layer wrap around the spherical substrate to form an inductor. The inductor may be used to create a transformer or an antenna.

4 Claims, 2 Drawing Sheets

SPHERICAL SHAPED INTEGRATED CIRCUIT UTILIZING AN INDUCTOR

BACKGROUND OF THE INVENTION

This is a continuation-in-part of application Ser. No. 08/858,004, filed May 16, 1997, which claims priority from provisional application Ser. No. 60/032,340, filed Dec. 4, 1996, now abandoned.

BACKGROUND OF THE INVENTION

The invention relates generally to semiconductor integrated circuits, and more particularly, to an apparatus and method for forming circuits with one or more inductors and a spherical-shaped semiconductor substrate.

Electrical devices such as semiconductor integrated circuits are advancing in many ways. For example, many devices are seeing an increase in overall size, and number of components and transistors. Furthermore, devices are encompassing more and more peripheral components on a circuit board. As a result, space is saved and communication speed is increased.

However, these semiconductor integrated circuits have not been able to encompass many different circuits. For example, circuits that utilize a conductor coil or an inductor have not been successfully implemented on a semiconductor integrated circuit. This is due, in part, to the relatively flat nature of conventional integrated circuits.

Conventional integrated circuit devices, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat. As a result, forming an inductor on a chip is difficult, if not impossible.

Referring to FIG. 1, one typical peripheral component for many circuit boards is a power circuit 10, represented here with a single phase rectifier. The power circuit 10 receives alternating current ("AC") power from a source 12 and reduces the voltage level of the source 12 with a transformer 14. The transformer 14 includes a primary coil 16 and a secondary coil 18. The secondary coil 18 is further connected to a bridge circuit 20, which provides a rectified, direct current ("DC") voltage to a load 22. Power circuits have not been incorporated onto conventional semiconductor devices.

Referring to FIGS. 2a and 2b, another typical peripheral component for many circuit boards is an antenna for transmitting or receiving electromagnetic waves. Two examples of an antenna include a loop antenna 24 (FIG. 2a) and a helical antenna 26 (FIG. 2b). Antennas have also not been incorporated onto conventional semiconductor devices.

In parent application Ser. No. 08/858,004 filed on May 16, 1997, a method and apparatus for manufacturing spherical-shaped semiconductor integrated circuit devices is disclosed. The present invention provides an apparatus and method for forming an inductor on the spherical shaped integrated circuit. The inductor may be used in a rectifier circuit and/or an antenna. Further, the antenna can be used to support communications from the integrated circuit device with other components.

SUMMARY OF THE INVENTION

The present invention, accordingly, provides a spherical shaped integrated circuit having an inductor for use in components such as a power circuit and/or an antenna. To this end, one embodiment provides an integrated circuit formed around a spherical substrate. The integrated circuit includes one or more one conductive layers. A portion of one of the conductive layers wraps around the spherical substrate to form an inductor. In one embodiment, the inductor is used to create a transformer. In another embodiment, the inductor is used as an antenna.

DESCRIPTION OF THE PREFERRED EMBODIMENT

Figure 3:
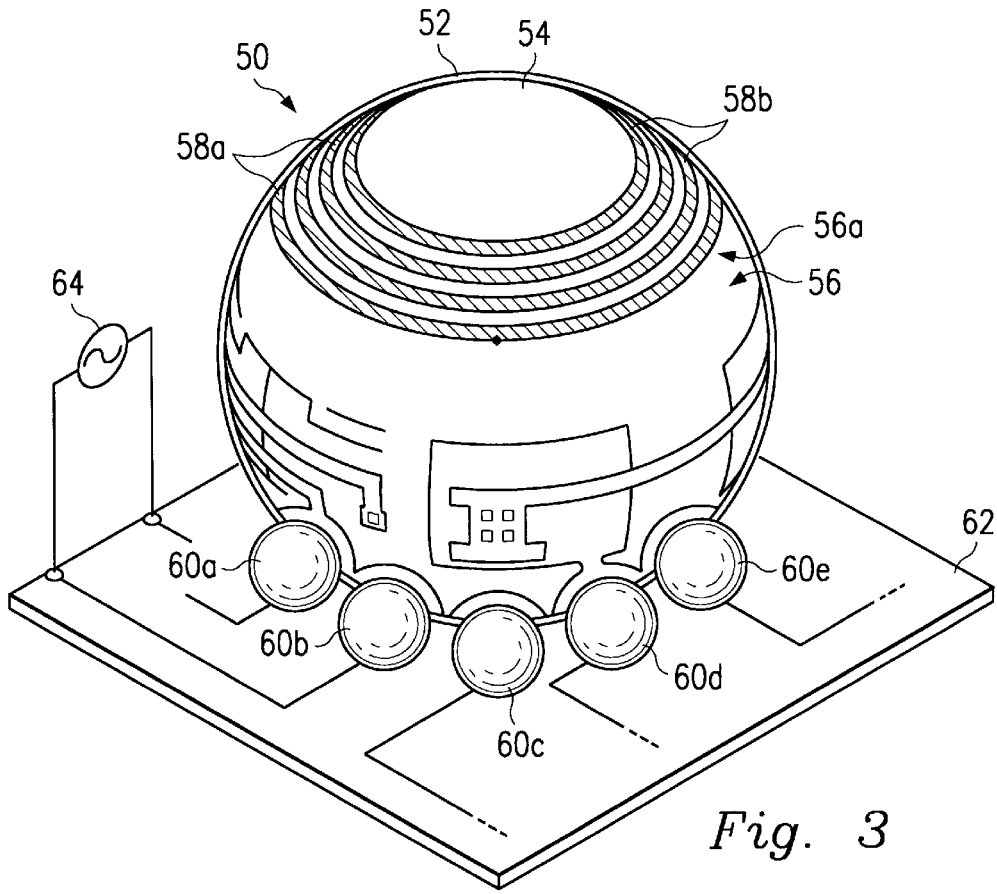
FIG. 3 illustrates a spherical-shaped integrated circuit device according to one embodiment of the invention.

Referring to FIG. 3, the reference numeral 50 designates, in general, a semiconductor integrated circuit device, preferably of a generally spherical shape. For the sake of example, the device could be of the same type formed according to the technique disclosed in the above-identified patent application Ser. No. 08/858,004.

The device 50 is covered by an insulative outer coat 52, which may also serve as an identification means for detecting a type (e.g., memory, logic) of the device. Immediately inside the outer coat 52 is a semiconductor substrate 54 and several integrated circuit ("IC") pattern layers 56. The IC pattern layers includes at least one metal layer 56a. For the sake of example, the metal layer 56a may be formed of aluminum by an inductively coupled plasma powder vaporization technique disclosed in patent application Ser. No. 09/033,180 filed Mar. 2, 1998, which is hereby incorporated by reference. The metal layer 56a is capable of completely circling the spherical substrate 54. Portions of the metal layer 56a are formed in concentric lines wrapping around the substrate, thereby forming coils 58a and 58b. The metal layer 56a is also isolated from other portions of the integrated circuit 56, as well as any other metal layers, with oxide layers for insulation.

Attached to the integrated circuit 56 are several bonding pads (not shown) and solder bumps 60a, 60b, 60c, and 60d. The solder bumps 60a–60d connect the device 50 to a circuit board 52. In one embodiment, two of the solder bumps, for example bumps 60a and 60b, are further connected to an AC power source 64.

Figure 1:
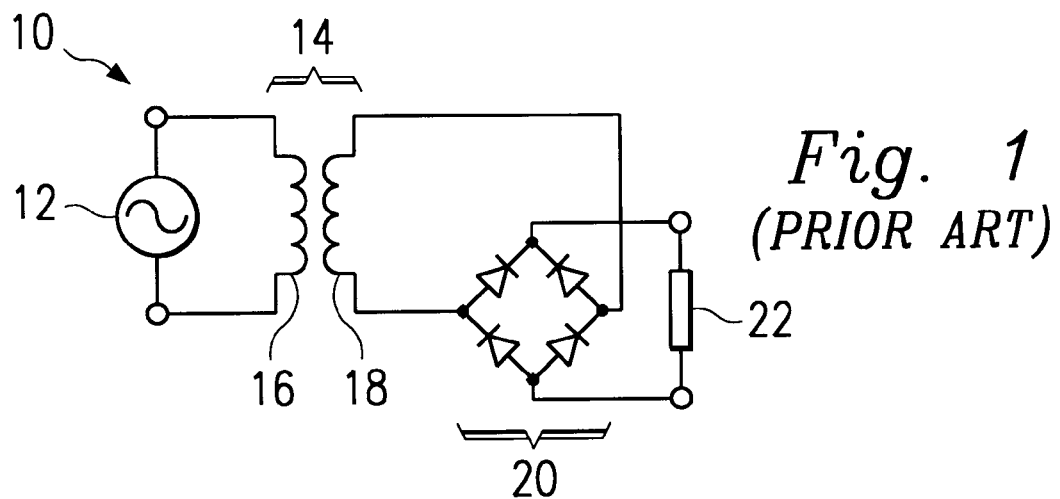
FIG. 1 is a schematic of a conventional single phase rectifier.
Figure 2A:
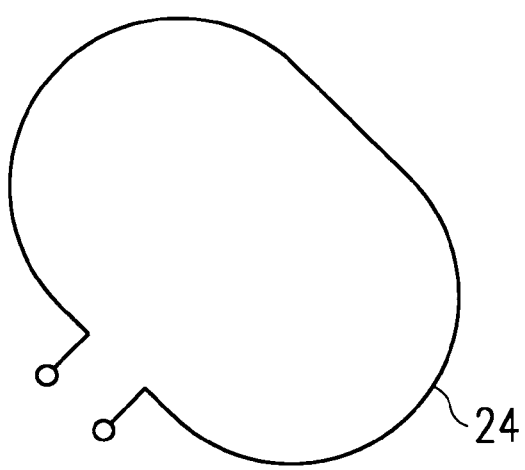
FIGS. 2a and 2b are schematics of conventional antennas.
Figure 2B:
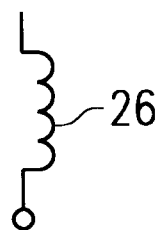

In one embodiment, the coils 58a, 58b corresponding to the two coils 16, 18, of the transformer 14 of FIG. 1. Also, additional portions of the integrated circuit 56 can be used to implement the bridge 20 and the load 22 of FIG. 1. As a result, the entire power circuit 10 of FIG. 1 can be implemented on the device 50 of FIG. 3.

In alternate embodiments, the substrate 54 may include Fe, Co, or Ni. These elements can be used to enhance the properties of inductance formed with the substrate. Further, different power circuits, such as a single transformer 14 without the bridge 20, can be implemented.

Figure 4:
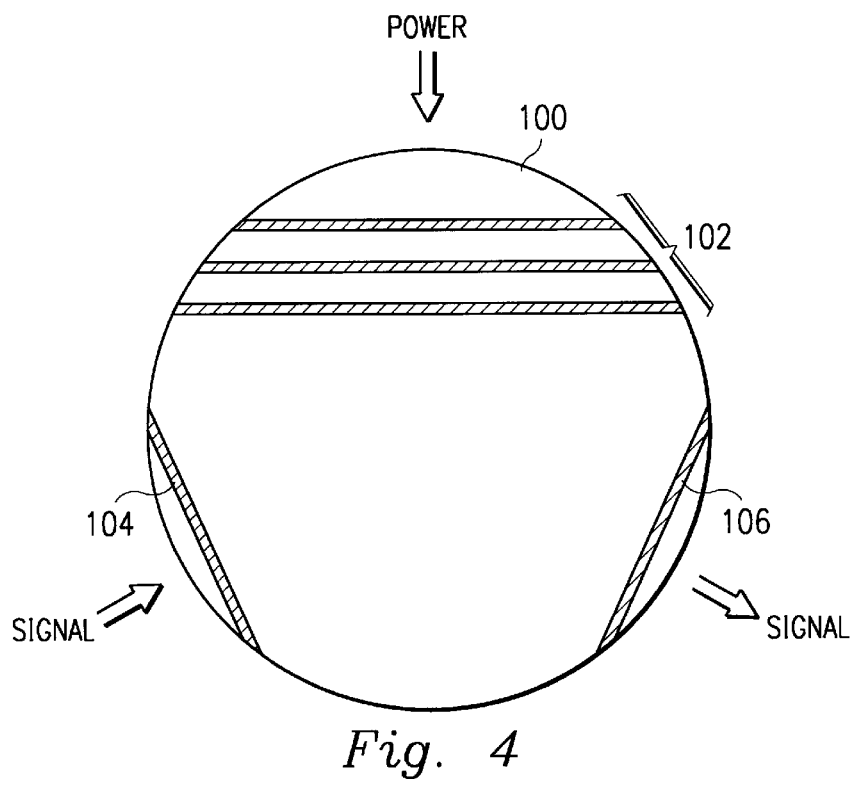
FIG. 4 illustrates a spherical-shaped integrated circuit device according to another embodiment of the invention.

Referring now to FIG. 4, the reference numeral 100 designates, in general, another semiconductor integrated circuit device, preferably of a generally spherical shape. The device 100 does not require any solder bumps, unlike the device 50 of FIG. 3. Other embodiments may include bonding pads and solder bumps for other purposes.

The device 100 includes a plurality of antennas. A first antenna 102 is a helical coil. The antenna 102 is capable of receiving a power pulse to enable the device 100 to operate, similar to U.S. Pat. No. 5,625,370, issued Apr. 29, 1997 and entitled Identification System Antenna with Impedance Transformer.

Antenna 104 is a loop-type signal receiving antenna. Antenna 106 is a loop-type signal transmitting antenna. The antennas 104, 106 are capable of receiving and transmitting wireless communications. Such communications can be with adjacent devices (not shown) that are on the same circuit board as the device 100, or from devices on another, separate circuit board. Alternatively, the communications can be with remote devices. For example, the device 100 can be part of a badge (also not shown) that an individual carries on his person, vehicle, luggage, etc. Since the device 100 receives a power pulse from the antenna 102, no separate power supply is required. The badge can respond to a power pulse by transmitting data through antenna 106 to identify the individual. The badge can also receive data through antenna 104 for additional purposes.

It is understood that several variations may be made in the foregoing. Modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A spherical shaped integrated circuit device comprising:

a spherical substrate;

an integrated circuit formed on the substrate, the integrated circuit including at least one conductive layer;

wherein a portion of the conductive layer wraps around the spherical substrate to form an inductor.

2. The device of claim 1 wherein the portion of the conductive layer is used to create a transformer.

3. The device of claim 2 wherein the transformer is part of a power circuit.

4. The device of claim 1 wherein the portion of the conductive layer is used as an antenna.

* * * * *